United States Patent [19]
Katsuyama et al.

[11] Patent Number: 4,838,633
[45] Date of Patent: Jun. 13, 1989

[54] SEMICONDUCTOR DEVICE WITH HIGH SPEED SIGNAL TRANSMISSION ARRANGEMENT UTILIZING LIGHT

[75] Inventors: Toshio Katsuyama, Hachioji; Hiroyoshi Matsumura, Iruma, both of Japan

[73] Assignee: Hitachi, Ltd., Tokyo, Japan

[21] Appl. No.: 827,611

[22] Filed: Feb. 10, 1986

[30] Foreign Application Priority Data

Mar. 18, 1985 [JP] Japan ................... 60-52214

[51] Int. Cl.$^4$ .......................... G02B 6/12; H01L 32/16
[52] U.S. Cl. .................................... 350/96.11; 357/19
[58] Field of Search .......................... 350/96.11, 96.12; 357/19, 30 L, 30 M, 40, 17

[56] References Cited

U.S. PATENT DOCUMENTS

| | | | |
|---|---|---|---|
| 4,136,928 | 1/1979 | Logan et al. | 360/96.11 |
| 4,274,104 | 6/1981 | Fong et al. | 357/19 |
| 4,327,962 | 5/1982 | Redman | 350/96.15 |
| 4,372,642 | 2/1983 | Singer et al. | 350/96.12 |
| 4,607,368 | 8/1986 | Hori | 357/19 |
| 4,626,878 | 12/1986 | Kuwano et al. | 357/19 |
| 4,709,371 | 11/1987 | West | 357/17 |
| 4,725,128 | 2/1988 | Bornzin et al. | 357/17 |

FOREIGN PATENT DOCUMENTS 0187198 7/1986 European Pat. Off. ......... 350/96.11

Primary Examiner—Gene Wan
Attorney, Agent, or Firm—Antonelli, Terry & Wands

[57] ABSTRACT

In a semiconductor device wherein a signal transmission in a semiconductor integrated electronic circuit is carried out partly or entirely by means of a light, the signal transmission on the light is carried out with multi-wavelength, waveguides or a photoelectric converter and an electronic integrated device are provided on a circuit board having an optical waveguide, thus providing a high performance and practical technique.

24 Claims, 4 Drawing Sheets

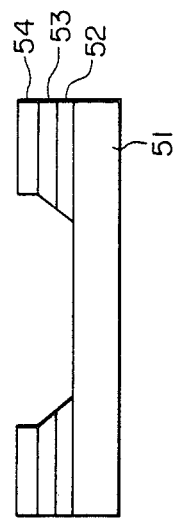
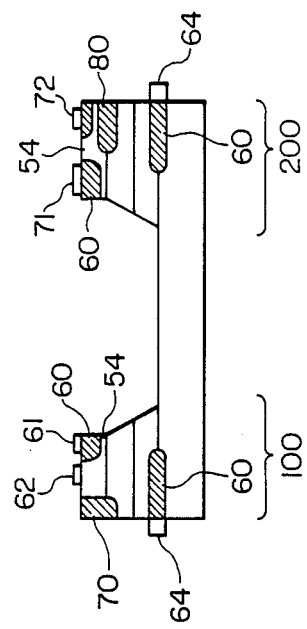
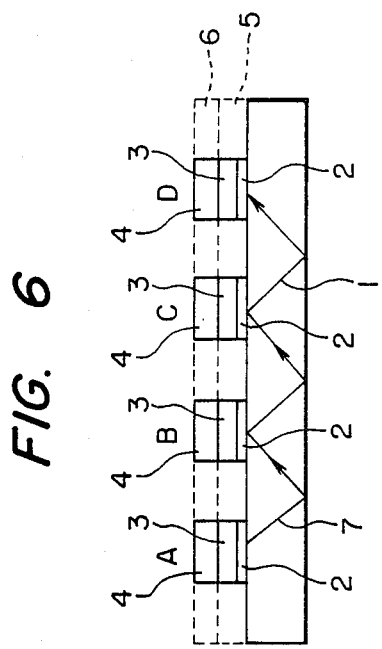
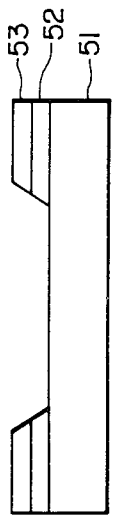

SEMICONDUCTOR DEVICE WITH HIGH SPEED SIGNAL TRANSMISSION ARRANGEMENT UTILIZING LIGHT

BACKGROUND OF THE INVENTION

The present invention relates to a semiconductor device comprising an electronic circuit for transmitting signals between devices or integrated devices easily and at high speed.

Technical advances realized in recent years for the process of manufacturing semiconductor devices have been extremely successful in obtaining integrated devices of extremely high density.

However, when large numbers of these high performance elements or devices are mounted in multitude on a printed circuit board or the like, the situation is such that a high density application of the device rather complicates a mechanism of signal transmission between the devices, and processing time of signals is restricted by the time for signal transmission between elements or devices instead of an operating time of the device. That is, an increase of mutual capacitance or a drop of driving voltage results from a high integration, a signal crosstalk is thus problematical, and a crosstalk according to an increase in number of connected wires between the devices is also at issue. In view of the situation, a method has been proposed for using light to transmit signals between the devices. ("OPTICAL INTERCONNECTIONS FOR VLSI SYSTEMS", by J. W. Goodman et al., Proc. of IEEE, Vol. 72, July 1974, P850 to P866.)

However, nothing is particularly referred to therein in regard to a concrete construction such as mounting technique and the like and a high performance technique such as wavelength multiplexing and the like.

As mentioned above, technical measures become necessary for enhancing signal transmission performance between elements in an integrated device or between integrated devices according to a high integration and high speed operation of elements and devices.

SUMMARY OF THE INVENTION

An object of the invention is to provide a semiconductor device wherein signals are transmitted in the form of light so as to realize high integration of a device as compared with prior art arrangements and also to cut the time for signal transmission and secure a mass storage of signals.

A mechanism of signal transmission becomes complicated as device integration becomes high, because the number of wires is increased and thus an area of wires is increased accordingly. The reason is that an electron is employed as a means of signal transmission. A potential inclination is necessary for leading electrons to a fixed place, and electrons carrying a different signal must be isolated to distinguish one signal from another signal. This may signify that one wiring is necessary correspondingly to one signal. Accordingly, it is unavoidable that the mechanism for signal transmission will be complicated if electrons are employed as the means for signal transmission.

Now, therefore, the inventor has invented an arrangement to introduce a light into semiconductor electronic device more effectively than in the prior art as a means for signal transmission. However, in the case of light, it is difficult to make a width of the waveguide for transmitting a signal smaller than a wavelength of the signal, and hence it is difficult to make the waveguide width smaller than a wiring width in the case of electron. In view of the above circumstances, the inventor has then invented a system of using the light having a further different wavelength as a means for signal transmission of the semiconductor device. In this case, simply from identifying the wavelength, signals with different waveguide can be transmitted through one waveguide. Further, where the signal has come from can easily be recognized, and thus it is not necessary at all to isolate the light in the waveguide, and a plurality of signals can be transmitted through one waveguide advantageously. That is, a portion for light transmission can be used in common to all signals.

FIG. 1a represents one example of a construction wherein the above-described method is realized. A second layer 2 in which a light transmitter/receiver 4 is formed is built under a first layer 1, and then a flat and transparent multi-wavelength light transmitting part 3 is formed thereunder. The light transmitter/receiver can be formed on a portion suitable for transmitting and receiving signals. The light transmitter/receiver 4 is coupled to an integrated device present on the first layer electrically or optically, transforms a signal from the integrated device into a light on the instant to transmission and reception, and thus transmits it to the integrated device. The signal will be discriminated, where necessary, by changing a wavelength of the light from the transmitter. For example, a light $\lambda_A$ in wavelength will be transmitted from a transmitter A, and a light $\lambda_B(\lambda_B \neq \lambda_A)$ in wavelength will be transmitted from a transmitter B. Then, a receiver C has only to receive the light $\lambda_A$ for receiving a light from A and has only to receive the light $\lambda_B$ for receiving a light from B.

Further, in the invention mentioned above, it goes without saying that information content of a transmittable signal will sharply be increased from modulating a signal light at high speed.

The light transmitting part 3 is shown as a flat layer structure in FIG. 1a, however, it can be constituted, needless to say, of a linear optical waveguide.

Then, as shown in FIG. 2, a high performance transmission is also realizable from connecting semiconductor devices through a multi-wavelength optical waveguide 5 such as optical fiber or the like. In this case, the optical waveguide 5 may be minimized in scale, and the multi-wavelength transmitter/receiver can be incorporated in an integrated device according to an integration technique, thus attaining miniaturization and high performance requirements.

According to the invention, a signal transmission rate can be raised ten times or higher compared with a conventional mounting on an electric wiring such as printed circuit board or the like.

A variety of signals can be transmitted simply at the same time from employing a so-called multiwavelength transmission system using particularly lights with different wavelength, therefore a high performance and miniaturization can be realized on a mounting device.

BRIEF DESCRIPTION OF THE DRAWINGS

FIG. 6 is an explanatory drawing of a fifth embodiment.

FIG. 7a to FIG. 7e and FIG. 8 are explanatory drawings of a sixth embodiment.

DETAILED DESCRIPTION OF THE PREFERRED EMBODIMENTS

Example 1

Figure 1A:
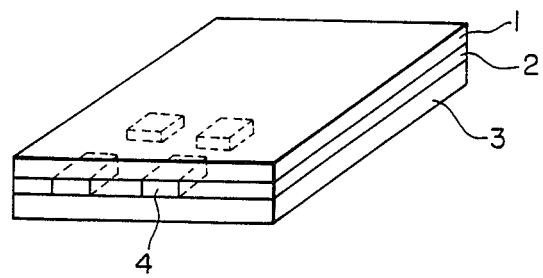
FIG. 1a represents one example of a semiconductor device according to the invention.

In FIG. 1a, one or more integrated electronic circuits such as LSI or the like are mounted on the first layer 1, and signals coming therefrom are generated as a light signals by the light emitting diodes 4 formed in the second layer 2 incidentally to each LSI. The light signal from the light emitting diode is propagated through the third layer 3 consisting of a quartz glass plate. Then, a PIN diode is formed in the second layer 2 incidentally to each LSI, thereby receiving the signal light to transform it into an electrical signal. The electrical signal is transmitted to other LSI. Each LSI is provided with an IC modulating the signal for transforming a signal from the LSI into a light signal. A logic circuit formed by such method is reduced 50% or so in size as compared with that for which an electrical wiring is used in prior arrangements. Accordingly, it is understood that the semiconductor device for which a signal transmission technique using light according to the invention is introduced can sharply be miniaturized as compared with the conventional one using an electrical wiring.

Figure 1B:
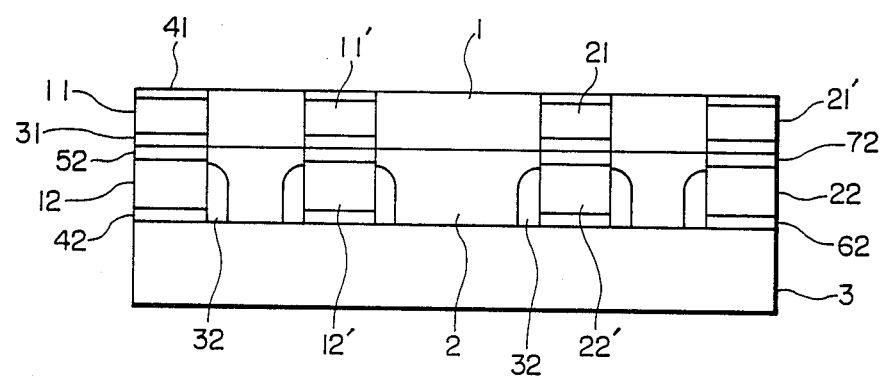
FIG. 1b is a sectional view representing a concrete constructional example of one embodiment.

A manufacturing process will now be described with reference to FIG. 1b.

Well-known light emitting diodes 12 and 12' (having electrodes 42 and 52) using GaAs semiconductors, well-known Si-PIN photodiodes 22 and 22' (having electrodes 62 and 72), and an optical waveguide 32 formed of GaAs semiconductor which connects the light emitting diodes, the photodiodes and the light transmission layer 3 optically are integrated in the second layer 2 formed of Si and are provided on the quartz glass plate 3 by means of an adhesive material, normal semiconductor integrated electronic circuits 11 and 21, two pieces each, are integrated in the first layer 1 formed of Si, which is then compressed and installed further thereon by means of a jig (not indicated).

In the device, a wavelength of the light emitting diode 12 is specified at 830 nm, and a wave length of that 12' is specified at 800 nm.

Then, a filter 830 nm in center transmitting light wavelength is provided between the optical waveguide 32 and the photodiode 22, and a filter 800 nm is provided between 32 and 22' each by a normal interference thin film.

Upon measuring outputs of electronic devices 21 and 21' by inputting 3 GHz and 4 GHz electrical signals to electronic devices 21 and 21' respectively, a 3 GHz electric output is obtained from the electronic device 21 and a 4 GHz electric output is obtained from 21', and an attenuation to the input is only 0.01 db.

In the device, a transmission speed between the input of the integrated devices 11 and 11' and the output of the integrated devices 21 and 21' is determined by whichever is lower in response speed among the integrated devices, light emitting diodes or light receiving elements. Therefore, performance of the elements and devices is perfectly utilized.

In the example, a similar effect is obtained also from using a well-known optical waveguide material such as GaAs compound semiconductor, InP compound semiconductor and the like as the third layer.

Further, a semiconductor laser can be employed instead of the light emitting diode.

Example 2

Figure 2:
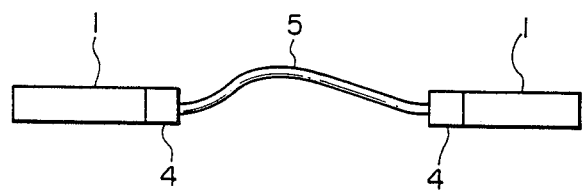
FIG. 2 is a block diagram of an embodiment wherein two semiconductor devices are connected through a multi-wavelength optical waveguide.

As shown in FIG. 2, two well-known semiconductor integrated devices 1 are coupled through a light transmission line such as optical fiber or the like for signal transmission.

In this case, a reference numeral 4 denotes a light-power mutual converter provided with a well-known photosynthesizer/wave separator such as a diffraction grid, a prism, and an optical coupling and others, and is constituted mainly of light emitting/receiving elements. An electrical signal on the sending side is converted into a light signal of various wavelengths, these are multiplexed and transmitted to the device 4 on the receiving side through an optical fiber, separated into each wavelength, converted further into an electrical signal and then transmitted to the integrated device 1.

Here, it goes without saying that the devices 1 and 4 on the receiving side and the sending side may be those of different structure and performance.

Example 3

Figure 3:
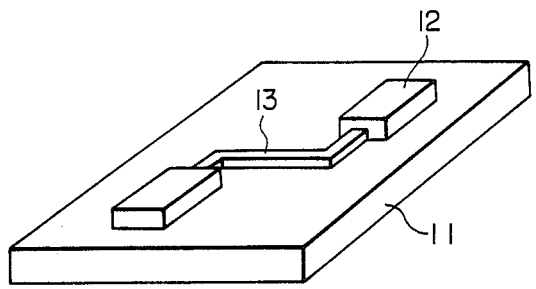
FIG. 3 is a block diagram of an embodiment wherein an integrated device is provided on a substrate having an optical waveguide.

FIG. 3 represents an example wherein the integrated photoelectric device 12 for which light emitting and receiving elements are formed on a well-known electronic device is disposed and connected on a circuit board having an optical waveguide network 13 for signal transmission with the optical waveguide 13. The integrated photoelectric device 12 is a well-known device having a light-power and/or power-light signal converter.

In the example, a 5 GHz signal can be transmitted.

Then, the substrate is a semiconductor such as glass, GaAs or the like, whereon an optical waveguide is constituted of glass or a semiconductor material different in refractive index from the substrate through a conventional technique like photoetching.

In the example, a similar effect is also obtained from using a multi-channel arrangement for the integrated photoelectric device and carrying out a so-called multi-wavelength transmission of different electrical signals on different wavelengths.

Example 4

Figure 4:
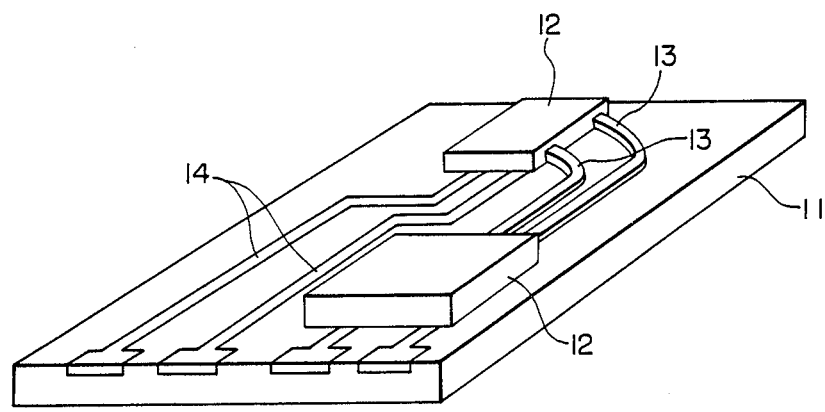
FIGS. 4 and 5 are block diagrams representing an embodiment wherein a circuit board has an optical waveguide and an electric wiring.

As shown in FIG. 4, the circuit board 11 has the optical waveguide 13 constituted of a material different in refractive index from the board 11 according to a known method. An electric wiring 14 is also provided, and thus power for driving the integrated device 12 is fed through the electric wiring 14.

In this case, since the optical waveguide is not subjected to an electromagnetic noise, the optical waveguide 13 can be kept close to the electric wiring 14, which may greatly facilitate the design of the device.

Figure 5:
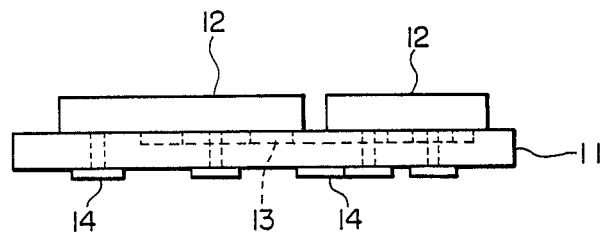

As an alternative, the device can be designed such that the optical waveguide network 13 and the electric wiring 14 are formed on two surfaces of the circuit board 11, which may intersect each other, and for example, as shown in FIG. 5, the optical waveguide network 11 is formed on one surface of the circuit board 11 and the electric wiring 14 is formed on the other surface, thereby obtaining a miniature and high performance semiconductor device.

It can easily be understood that those of ribbon wiring, printed wiring and the like which are well known hitherto will be applicable to the electric wiring.

A multi-wavelength transmission is also realized in the example as in the case of Example 3.

Example 5

As shown in FIG. 6, a device consisting of an arithmetic circuit 4 comprising an integrated circuit (LSI), a light transmitter/receiver 3 and a wavelength selector filter 2 is disposed on a quartz plate (2 mm thick). In the example, a construction is such that a signal from LSI A is received at D, and a signal from LSI B is received at C. Here, each LSI is formed of a normal Si, including a driving circuit for the transmitter/receiver 3. The transmitter/receiver is a junction type light emitting diode for A and D which includes a GaAs portion emitting light which is 0.83 $\mu$m in wavelength, and is provided with the filter 2 which permits only the light with wavelengths of 0.80 to 0.85 $\mu$m to pass by means of a dielectric multilayer film consisting of $TaO_2$. B and C represent GaAs junction type light emitting diodes somewhat different in composition from those of A and D, emitting light 0.87 $\mu$m in wavelength. Then, the filter 2 for B and C is formed so as to permit only light which is 0.85 to 0.90 $\mu$m in wavelength to pass. Under such state, an operational output of LSI A is impressed on the light emitting diode 3 as a bias current according to a pulse code modulation system. Then, a signal light a 20 Kbit/s in a pulse train is emitted toward the quartz plate from the light emitting diode 3 coupled to the LSI A. As illustrated, the light is propagated in the quartz plate as by reflection, and reaches the light emitting diode 3 of D. When the light is incident thereon, the light emitting diode 3 of D permits a bias current to flow instead of emitting a light. That is, the light emitting diode is used as a light receiving element. As a result, a signal from LSI A reaches LSI D according to an output of the light receiving element 3. In this case, a signal between A and D does not reach B, C through the filter 2, and thus the signal between desired LSI's only can be transmitted. Isolation of the signal transmission between A and D and also between B and C is good, and can be higher.

Example 6

Referring to FIG. 7a to FIG. 7d, a $Ga_{0.7}Al_{0.3}As$ layer 52 and a $Ga_{0.5}Al_{0.5}As$ layer 53 are provided on a GaAs substrate 51 according to a normal epitaxy process (FIG. 7a), and then central portions of the layers 52 and 53 are removed through etching, as shown in FIG. 7b. In this case, the etched surface is kept inclined. Next, a GaAs layer 54 is formed on the layer 53 according to an epitaxy process (FIG. 7c), which is doped with Si to n layer. Then, domains 60, 70 and 80 indicated by oblique lines in FIG. 7d are doped excessively with Si to a conductive $n^+$ layer each. Finally, a source electrode 61, a gate electrode 61 and a light emitting electrode 64 are formed according to a normal evaporation process, thus completing the sending side of the integrated circuit.

Here, an element on the sending side is indicated by 100, and an element on the receiving side is indicated by 200.

Figure 8:
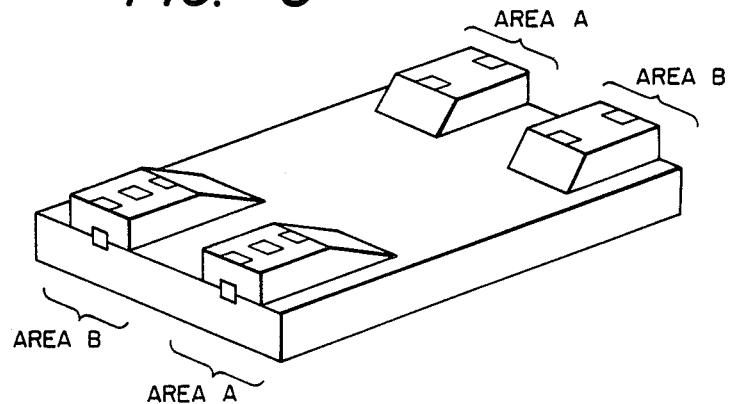

Further, as shown in FIG. 8, an element is formed on a area A of the substrate according to the above process, and then an element is formed on a area B as in the case of area A with the layer 52 as $Ga_{0.8}Al_{0.2}As$ and the layer 53 as $Ga_{0.6}Al_{0.4}As$, thus obtaining another integrated circuit.

An electrical signal 20 GHz and S/N 39.5 dB is obtained between electrodes 71 and 72 from impressing a DC voltage between the source electrode 61 and the light emitting electrode 64 and also between the source electrode 71 and the light emitting electrode 64 on the receiving side and impressing a signal voltage 20 GHz and S/N 40 dB on the gate electrode 62.

Figure 7E:
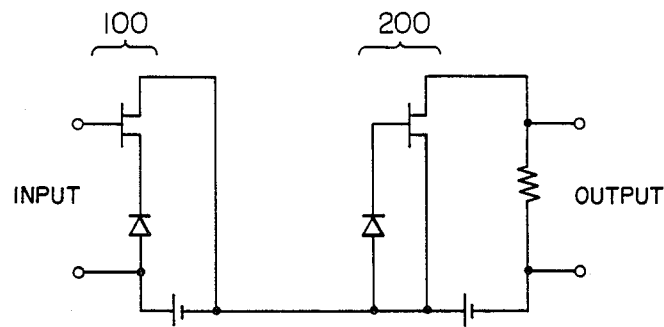

Two different kinds of signals can be transmitted concurrently in the device of FIG. 7d. An equivalent network of the device in the example is shown in FIG. 7e.

Figure 9:
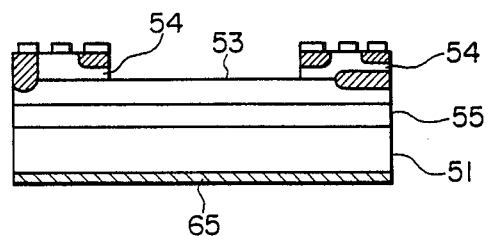
FIG. 9 is an explanatory drawing of a seventh embodiment.

Example 7 (FIG. 9)

A $Ga_{0.8}Al_{0.2}As$ layer 55 is formed on the GaAs substrate 51 according to an epitaxy process, and a $Ga_{0.5}Al_{0.5}As$ layer 53 is formed thereon. After forming a GaAs layer 54 further thereon, an n layer and an $n^+$ layer are formed as in the case of EXAMPLE 6, and then each electrode and a back electrode 65 are formed.

The device operates likewise as in the case of

Example 6.

What is claimed is:

1. A semiconductor electronic circuit apparatus comprising:
    a first integrated electronic circuit;
    a first means for transmitting a light, wherein said first means is capable of transmitting light of at least one predetermined wavelength from a predetermined plurality of different wavelengths and is coupled to said first integrated circuit;
    a second means for receiving the light transmitted from said first means for transmitting, wherein said second means for receiving includes means for selectively receiving light of said at least one predetermined wavelength;
    a second integrated electronic circuit coupled to said second means for receiving; and
    a third means for guiding the light from said first means for transmitting to said second means for receiving, wherein said third means is capable of transmitting the predetermined plurality of different wavelengths of said light,
    whereby the transmission of a signal from the first integrated electronic circuit to the second integrated electronic circuit does not suffer from crosstalk from transmission of signals between other integrated electronic circuits coupled to said third means.

2. A semiconductor electronic circuit apparatus as claimed in claim 1, wherein said second means for receiving is capable of transmitting light of at least a predetermined wavelength from the predetermined plurality of different wavelengths, and said first means for transmitting is capable of receiving light of at least a predetermined wavelength within the predetermined plurality of different wavelengths.

3. A semiconductor electronic circuit apparatus as claimed in claim 1, wherein said third means includes an optical fiber.

4. A semiconductor electronic circuit apparatus as claimed in claim 1, wherein said first integrated electronic circuit is substantially identical to said second integrated electronic circuit.

5. A semiconductor electronic circuit apparatus as claimed in claim 1, wherein said first and second integrated electronic circuits and said third means are provided on a circuit board.

6. A semiconductor electronic circuit apparatus as claimed in claim 1, wherein said first means for transmitting is electrically coupled to said first integrated electronic circuit.

7. A semiconductor electronic circuit apparatus as claimed in claim 1, wherein said first means for transmitting is optically coupled to said first integrated electronic circuit.

8. A semiconductor electronic circuit apparatus as claimed in claim 1, wherein said second means for receiving is electrically coupled to said second integrated electronic circuit.

9. A semiconductor electronic circuit apparatus as claimed in claim 1, wherein said second means for receiving is optically coupled to said second integrated electronic circuit.

10. A semiconductor electronic circuit apparatus as claimed in claim 5, wherein said third means for guiding is a type of linear optical waveguide.

11. A semiconductor electronic circuit apparatus as claimed in claim 5, wherein said third means for guiding has a flat layer structure.

12. A semiconductor electronic circuit apparatus as claimed in claim 10, wherein said circuit board includes electronic wiring coupled to said first and second integrated electronic circuits.

13. A semiconductor electronic circuit apparatus as claimed in claim 12, wherein said third means for guiding and said electric wiring are disposed so as to have a portion where image projections thereof intersect each other.

14. A semiconductor electronic circuit apparatus according to claim 1, wherein the light being guided by said third means has a plurality of wavelengths.

15. A semiconductor electronic circuit apparatus characterized in that signal transmissions between a plurality of integrated electric circuits are at least partly carried out by means of light signals, and further characterized in that different wavelenghts of said light are used for different signal transmissions so that crosstalk in signal transmissions between said plurality of integrated electric circuits is avoided.

16. A semiconductor electronic circuit apparatus as claimed in claim 15, wherein said different wavelengths are transmitted via a multi-wavelength optical guide between said plurality of integrated electric circuits.

17. A semiconductor electronic circuit apparatus characterized in that signal transmissions between a plurality of integrated electric circuits are at least partly carried out by means of light signals, and further characterized in that information of different signal transmissions are respectively provided on light of different wavelengths so that crosstalk in signal transmissions between said plurality of integrated electric circuits is avoided.

18. A semiconductor electronic circuit apparatus as claimed in claim 17, wherein said different wavelengths are transmitted via a multi-wavelength optical guide between said plurality of integrated electric circuits.

19. A semiconductor electronic circuit apparatus comprising:
first, second, third and fourth integrated electronic circuits;
a first light emitting device coupled to the first integrated electronic circuit, said first light emitting device including means for converting an electric output of the first integrated electronic circuit into a first light signal having a first predetermined wavelength;
a second light emitting device coupled to the second integrated electronic circuit, said second light emitting device including means for converting an electric output of said second integrated electronic circuit into a second light signal having a second predetermined wavelength different from the first predetermined wavelength;
a multi-wavelength optical waveguide coupled to the first and second light emitting devices and capable of propagating both the first and second light signals;
a first light receiving device coupled between the multi-wavelength optical waveguide and the third integrated electronic circuit, said first light receiving device including means for receiving the first light signal but not the second light signal, and further including means for converting the first light signal into an electric signal to be provided to the third integrated electronic circuit; and
a second light receiving device coupled between the multi-wavelength optical waveguide and the fourth integrated electronic circuit, said second light receiving device including means for receiving the second light signal but not the first light signal, and further including means for converting the second light signal into an electric signal to be provided to the fourth integrated electronic circuit,
whereby the transmission of signals between said first and third integrated electronic circuits and the transmission of signals between said second and fourth integrated electronic circuits does not suffer from crosstalk with one another.

20. A semiconductor electronic circuit apparatus according to claim 19, wherein the multi-wavelength optical waveguide comprises a first semiconductor layer, wherein the first and second light emitting devices and the first and second light receiving devices are formed in a second semi conductor layer formed on the first semiconductor layer, and wherein the first, second, third and fourth integrated electronic circuits are formed in a third semiconductor layer formed on the second semiconductor layer.

21. A semiconductor device characterized in that a signal transmission in a semiconductor integrated electronic circuit is carried out at least partly by means of a light of different wavelengths so that said signal transmission does not suffer from crosstalk from signal transmissions in other semiconductor integrated electronic circuits.

22. The semiconductor device as defined in claim 21, provided with a layer for propagating the light transmitting a signal.

23. The semiconductor device as defined in claim 21, wherein said integrated electronic circuit is provided on a circuit board having an optical waveguide for propagating said light.

24. The semiconductor device as defined in claim 21, wherein said integrated electronic circuit is provided on a circuit board having an optical waveguide for propagating said light and an electric wiring.

* * * * *